(12) United States Patent
Takano

(10) Patent No.: US 7,133,305 B2
(45) Date of Patent: Nov. 7, 2006

(54) SEMICONDUCTOR MEMORY DEVICE

(75) Inventor: Yoh Takano, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 118 days.

(21) Appl. No.: 10/947,367

(22) Filed: Sep. 23, 2004

(65) Prior Publication Data
US 2005/0073870 A1  Apr. 7, 2005

(30) Foreign Application Priority Data
Oct. 2, 2003  (JP) .............................. 2003-344467

(51) Int. Cl.
G11C 11/22 (2006.01)
(52) U.S. Cl. .................. 365/145; 365/189.07
(58) Field of Classification Search ................ 365/145, 365/149, 189.07
See application file for complete search history.

(56) References Cited

U.S. PATENT DOCUMENTS

| 5,270,967 | A | * | 12/1993 | Moazzami et al. | ......... 365/145 |
| 5,274,583 | A | * | 12/1993 | Rapp | .......................... 708/823 |
| 6,519,175 | B1 | * | 2/2003 | Sadayuki | .................... 365/145 |
| 6,901,002 | B1 | * | 5/2005 | Matsushita | .................. 365/145 |
| 7,012,829 | B1 | * | 3/2006 | Kawashima et al. | ........ 365/145 |

OTHER PUBLICATIONS

Yeonbae Chung et al., "A 3.3-V 4-Mb Nonvolatile Ferroelectric RAM with a Selectively-Drive Double-Pulsed Plate Read/Write-Back Scheme," 1999 Symposium on VLSI Circuits Digest of Technical Papers, Jun. 17-19, 1999/Kyoto, 4-930813-95-6/99, pp: cover, x, 97-98.
Noboru Sakimura et al., "A 512Kb Cross-Point Cell MRAM," 2003 IEEE International Solid-State Circuits Conference, 0-7803-7707-9/03, ISSCC 2003/Session 16/Non-Volatile Memory/Paper 16.1, pp. 15-16, Figures 16.1.1-16.1.5.

* cited by examiner

Primary Examiner—Tan T. Nguyen
(74) Attorney, Agent, or Firm—Arent Fox PLLC

(57) ABSTRACT

A semiconductor memory device capable of suppressing size increase and reducing the operating time is provided. This semiconductor memory device comprises storage portion, connected to a data read line, containing a material having a hysteresis property and data read portion connected to the data read line for reading data stored in the storage portion, for supplying prescribed energy capable of changing a storage state of the storage portion from an initial state supplying no prescribed energy and thereafter returning the intensity of the energy to a level not changing the storage state for reading the data with the data read portion on the basis of the current state of the data read line and the state of the data read line in the initial state in data reading.

13 Claims, 3 Drawing Sheets

SEMICONDUCTOR MEMORY DEVICE

BACKGROUND OF THE INVENTION

1. Field of the Invention

The present invention relates to a semiconductor memory device, and more particularly, it relates to a semiconductor memory device comprising data read means reading data stored in storage means.

2. Description of the Background Art

A semiconductor memory device comprising data read means for reading data stored in storage means is known in general. FIG. 5 shows the structure of a one-transistor one-capacitor (1T1C) ferroelectric memory comprising a comparator (data read means) as an exemplary semiconductor memory device comprising data read means. The ferroelectric memory is a nonvolatile memory utilizing pseudo capacitance variation responsive to the direction of polarization of a ferroelectric substance as a memory element. As shown in FIG. 5, this 1T1C ferroelectric memory comprises a memory cell (storage means) 101 connected between a word line WL and a plate line PL and between the plate line PL and a bit line BL and a comparator 102 connected to the bit line BL. The memory cell 101 includes a ferroelectric capacitor 103 and a selection transistor 107. The word line WL is connected to the gate of the selection transistor 107. The comparator 102 is supplied with a reference potential Vref generated by a prescribed method.

In a read operation, the conventional 1T1C ferroelectric memory shown in FIG. 5 activates the word line WL, thereby turning on the selection transistor 107. Thereafter the ferroelectric memory applies a prescribed read potential to the plate line PL. Thus, a potential responsive to data "1" or "0" stored in the memory cell 101 appears on the bit line BL. Thereafter the ferroelectric memory generates an intermediate potential between those corresponding to the data "1" and "0" respectively by the prescribed method and supplies this potential to the comparator 102. The ferroelectric memory employs the potential generated by the prescribed method as the reference potential Vref and compares the potential corresponding to the data of the memory cell 101 appearing on the bit line BL with the reference potential Vref through the comparator 102, thereby determining the data read from the memory cell 101 as "0" or "1". The ferroelectric memory outputs the data "1" or "0" of the memory cell 101 determined as "0" or "1" from the comparator 102.

FIG. 6 shows a one-capacitor (1C) cross-point ferroelectric memory comprising a comparator (data read means) 112 as another exemplary conventional semiconductor memory device comprising data read means. As shown in FIG. 6, the 1C cross-point ferroelectric memory comprises a word line WL, a bit line BL, a memory cell 111 connected to the word line WL and the bit line BL and the comparator 112 connected to the bit line BL. The memory cell 111 is constituted of only a ferroelectric capacitor 113 consisting of the word line WL, the bit line BL and a ferroelectric film (not shown) arranged between the word line WL and the bit line BL. The comparator 112 is supplied with a reference potential Vref generated by a prescribed method.

In a read operation, the conventional 1C cross-point ferroelectric memory shown in FIG. 6 applies a read potential to the word line WL. Thus, a potential responsive to data "1" or "0" stored in the memory cell 111 appears on the bit line BL. At this time, the ferroelectric memory generates the reference potential Vref at an intermediate level between potentials corresponding to the data "1" and "0" respectively by the prescribed method and supplies the same to the comparator 112. Similarly to the aforementioned 1T1C ferroelectric memory, the 1C cross-point ferroelectric memory compares the potential corresponding to the data read from the memory cell 111 on the bit line BL with the reference potential Vref through the comparator 112, thereby determining the data "0" or "1" and outputting the same from the comparator 112.

However, the conventional 1T1C ferroelectric memory shown in FIG. 5 utilizing the reference potential Vref for determining the data "0" or "1" read on the bit line BL must be provided with a circuit for generating the reference potential Vref. Thus, the size of the ferroelectric memory is disadvantageously increased.

The 1C cross-point ferroelectric memory shown in FIG. 6, also employing the reference potential Vref for determining the data "0" or "1" read from the memory cell 111 on the bit line BL, is also disadvantageously increased in size similarly to the conventional 1T1C ferroelectric memory shown in FIG. 5.

Therefore, a semiconductor memory device capable of determining data without a reference potential is proposed in general. For example, "A 512 Kb Cross-Point Cell MRAM", ISSCC 2003/SESSION 16/NON-VOLATILE MEMORY/PAPER 16.1, for example, proposes such a semiconductor memory device.

The aforementioned literature "A 512 Kb Cross-Point Cell MRAM", ISSCC 2003/SESSION 16/NON-VOLATILE MEMORY/PAPER 16.1 discloses a cross-point MRAM (magnetic random access memory) constituted to perform self-comparative reading requiring no reference potential in a read operation. More specifically, the aforementioned cross-point MRAM performs first data reading from a memory cell while holding a voltage corresponding to the read data. Then, the MRAM writes data "0" or "1" in the memory cell. Then, the MRAM performs second data reading from the memory cell while comparing the held voltage corresponding to the data read through the first data reading with a voltage corresponding to the data "0" or "1" read through the second data reading, thereby determining the data read through the first data reading. The cross-point MRAM disclosed in the aforementioned literature "A 512 Kb Cross-Point Cell MRAM", ISSCC 2003/SESSION 16/NON-VOLATILE MEMORY/PAPER 16.1 may not employ a reference potential due to the self-comparative reading.

However, the cross-point MRAM proposed in the aforementioned literature "A 512 Kb Cross-Point Cell MRAM", ISSCC 2003/SESSION 16/NON-VOLATILE MEMORY/PAPER 16.1 requires three cycles of operations, i.e., the first read operation, the operation of writing the data "0" or "1" and the second read operation, in order to read the data from the memory cell and determine the same. Thus, the operating time of the cross-point MRAM is disadvantageously increased due to the large number of operations.

SUMMARY OF THE INVENTION

The present invention has been proposed in order to solve the aforementioned problems, and an object thereof is to provide a semiconductor memory device capable of suppressing size increase and reducing the operating time.

In order to attain the aforementioned object, a semiconductor memory device according to a first aspect of the present invention comprises storage means, connected to a data read line, containing a material having a hysteresis property and data read means connected to the data read line for reading data stored in the storage means. The semiconductor memory device supplies prescribed energy capable of changing a storage state of the storage means from an initial state supplying no prescribed energy and thereafter returns the intensity of the energy to a level not changing the storage state for reading the data with the data read means on the basis of the current state of the data read line and the state of the data read line in the initial state in data reading. The aforementioned term "energy" indicates an electric field, a magnetic field, a temperature or the like.

The semiconductor memory device according to the first aspect, supplying the prescribed energy capable of changing the storage state of the storage means from the initial state supplying no prescribed energy and thereafter returning the intensity of the energy to the level not changing the storage state for reading the data with the data read means on the basis of the current state of the data read line and the state of the data read line in the initial state in data reading as hereinabove described, can read the data without a reference potential or the like by comparing the potential of the data read line upon return of the intensity of the energy to the level not changing the storage state with the state of the data read line in the initial state, for example. Thus, no circuit may be provided for generating a reference potential or the like, whereby the semiconductor memory device can be inhibited from size increase. Further, the semiconductor memory capable of reading the data by simply supplying the energy and returning the intensity thereof can reduce the operating time.

The aforementioned semiconductor memory device according to the first aspect preferably supplies the energy capable of changing the storage state of the storage means from the initial state supplied with no prescribed energy capable of changing the storage state of the storage means and thereafter returns to the initial state by eliminating the energy for reading the data with the data read means on the basis of the current state of the data read line and the state of the data read line in the initial state in the data reading. According to this structure, the semiconductor memory device can easily read the data without employing a reference potential or the like by comparing the potential of the data read line appearing when returning to the initial state by eliminating the energy with the potential of the data read line in the initial state.

In the aforementioned semiconductor memory device according to the first aspect, the storage means may include a ferroelectric capacitor, connected to the data read line, having the hysteresis property.

A semiconductor memory device according to a second aspect of the present invention comprises storage means, connected between a bit line and a voltage application line, containing a material having a hysteresis property and data read means connected to the bit line for reading data stored in the storage means. The semiconductor memory device brings the bit line into a floating state while applying a voltage capable of changing a storage state of the storage means to the voltage application line from an initial state where the potential difference between the bit line and the voltage application line is substantially 0 V and thereafter returns the voltage of the voltage application line to a level not changing the storage state of the storage means for reading the data with the data read means on the basis of the current potential of the bit line and the potential of the bit line in the initial state in data reading.

The semiconductor memory device according to the second aspect, bringing the bit line into the floating state while applying the voltage capable of changing the storage state of the storage means to the voltage application line from the initial state where the potential difference between the bit line and the voltage application line is substantially 0 V and thereafter returning the voltage of the voltage application line to the level not changing the storage state of the storage means for reading the data with the data read means on the basis of the current potential of the bit line and the potential of the bit line in the initial state in data reading as hereinabove described, can read the data without employing a reference potential by comparing the potential of the bit line appearing when returning the voltage of the voltage application line to the level not changing the storage state of the storage means with the potential of the bit line in the initial state, for example. Thus, no circuit may be provided for generating a reference potential, whereby the semiconductor memory device can be inhibited from size increase. Further, the semiconductor memory device capable of reading the data by simply activating and inactivating the voltage application line can reduce the operating time as well as current consumption.

In the aforementioned semiconductor memory device according to the second aspect, the voltage application line is preferably a word line, the storage means preferably consists of a ferroelectric capacitor, connected between the word line and the bit line, having the hysteresis property, and the semiconductor memory device preferably brings the bit line into the floating state while applying a voltage capable of changing a storage state of the ferroelectric capacitor to the word line from the initial state where the potential difference between the bit line and the word line is substantially 0 V and thereafter returns the word line to the potential in the initial state for reading the data with the data read means on the basis of the current potential of the bit line and the potential of the bit line in the initial state in the data reading. According to this structure, the semiconductor memory device, reading the data on the basis of the potential of the bit line appearing when returning the word line to the potential in the initial state and the potential of the bit line in the initial state, can read the data without employing a reference potential. Further, the semiconductor memory device capable of reading the data by simply activating and inactivating the word line can reduce the operating time as well as current consumption.

In this case, the data read means preferably includes an inverter circuit, provided with an input terminal connected to the bit line and an output terminal, having a prescribed logical threshold and a switch connected to the input terminal and the output terminal of the inverter circuit, and the semiconductor memory device preferably turns on the switch of the data read means for setting an input and an output of the inverter circuit to the potential of the logical threshold thereby precharging the bit line to the potential of the logical threshold of the inverter circuit in the initial state, turns off the switch of the data read means for changing the potential of the bit line from the potential of the logical threshold of the inverter circuit by a prescribed level in the floating state of the bit line and varies the output of the inverter circuit with whether the potential of the bit line input in the inverter circuit is larger or smaller than the logical threshold of the inverter circuit thereby reading the data in the data reading. According to this structure, the semiconductor memory device can easily read the data on the basis of the logical threshold of the inverter circuit corresponding to the bit line potential in the initial state and the potential of the bit line appearing when returning the word line to the potential in the initial state. In this case, the data read means may be constituted of a chopper comparator including the inverter circuit and the switch.

In the aforementioned structure that the data read means includes the inverter circuit, the inverter circuit preferably outputs a high-level signal when the potential of the bit line is smaller than the logical threshold of the inverter circuit, while outputting a low-level signal when the potential of the bit line is larger than the logical threshold of the inverter circuit. According to this structure, the semiconductor memory device can easily determine the data as high- or low-level data and read the same through the inverter circuit.

In the aforementioned structure that the data read means includes the inverter circuit, the difference between the potential of the bit line input in the inverter circuit in the data reading and the potential of the logical threshold of the inverter circuit is preferably larger than the sensitivity of the inverter circuit. According to this structure, the semiconductor memory device can easily read the data on the basis of the potential of the bit line input in the inverter circuit in the data reading and the potential of the logical threshold of the inverter circuit through the inverter circuit.

In the aforementioned structure that the data read means includes the switch, the switch preferably includes a transistor having a prescribed capacitance between a gate and a diffusion layer, and the transistor is preferably turned off in the floating state of the bit line thereby changing the potential of the bit line from the level of the logical threshold of the inverter circuit by a prescribed level corresponding to the prescribed capacitance of the transistor. According to this structure, the semiconductor memory device can easily change the potential of the bit line from that of the logical threshold of the inverter circuit by the prescribed level by turning off the switch including the transistor.

In the aforementioned structure reading the data on the basis of the potential of the bit line appearing when returning the word line to the potential in the initial state and the potential of the bit line in the initial state, the semiconductor memory device preferably precharges the bit line to a prescribed potential in the initial state and determines the data in response to whether the potential of the bit line is substantially equal to or different from the prescribed potential in the initial state in the data reading. According to this structure, the semiconductor memory device can easily read the data on the basis of the prescribed potential of the bit line in the initial state and the potential of the bit line appearing when returning the word line to the initial state.

In the aforementioned case where the storage means consists of the ferroelectric capacitor connected between the word line and the bit line, the storage means preferably consists of a single ferroelectric capacitor. According to this structure, a simple matrix ferroelectric memory can read data and reduce the operating time as well as current consumption without employing a reference potential.

A semiconductor memory device according to a third aspect of the present invention comprises storage means including a ferroelectric capacitor, connected between a bit line and a word line, having a hysteresis property and data read means connected to the bit line for reading data stored in the storage means, for bringing the bit line into a floating state while applying a voltage capable of changing a storage state of the ferroelectric capacitor to the word line from an initial state where the potential difference between the bit line and the word line is substantially 0 V and thereafter returning the word line to the potential in the initial state for reading the data on the basis of the current potential of the bit line and the potential of the bit line in the initial state in the data reading.

The semiconductor memory device according to the third aspect, bringing the bit line into the floating state while applying the voltage capable of changing the storage state of the ferroelectric capacitor to the word line from the initial state where the potential difference between the bit line and the word line is substantially 0 V and thereafter returning the word line to the potential in the initial state for reading the data on the basis of the current potential of the bit line and the potential of the bit line in the initial state in the data reading as hereinabove described, can read the data without employing a reference potential by comparing the potential of the bit line appearing when returning the word line to the potential in the initial state with the potential of the bit line in the initial state. Thus, no circuit may be provided for generating a reference potential, whereby the semiconductor memory device can be inhibited from size increase. Further, the semiconductor memory device capable of reading the data by simply activating and inactivating the voltage application line can reduce the operating time as well as current consumption.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
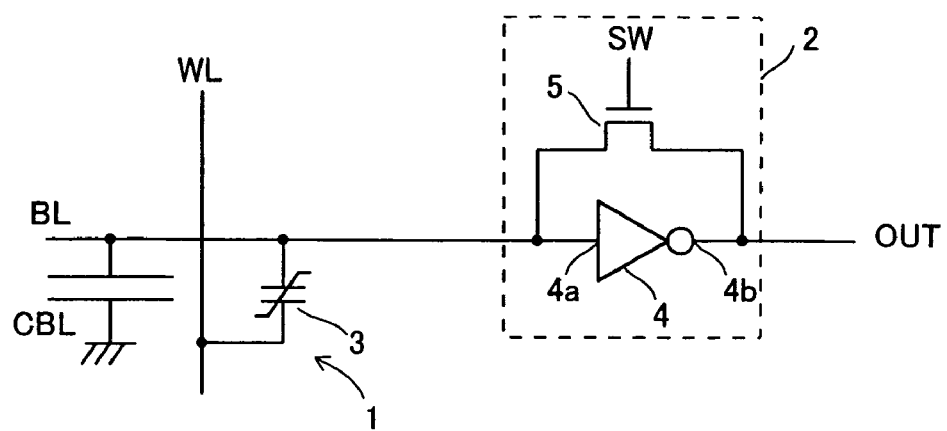
FIG. 1 is a circuit diagram showing the structure of a cross-point ferroelectric memory (semiconductor memory device) according to an embodiment of the present invention.

Embodiments of the present invention are now described with reference to the drawings.

The structure of a cross-point ferroelectric memory according to an embodiment of the present invention is described with reference to FIG. 1.

The cross-point ferroelectric memory according to the embodiment comprises a bit line BL and a word line WL arranged to extend in intersectional directions respectively, a memory cell 1 connected between the bit line BL and the word line WL for storing data and a chopper comparator 2 connected to the bit line BL. The bit line BL is an example of the "data read line" in the present invention, and the word line WL is an example of the "voltage application line" in the present invention. The chopper comparator 2 is an example of the "data read means" in the present invention.

The bit line BL has a prescribed parasitic capacitance CBL. The memory cell 1 is constituted of only a ferroelectric capacitor 3 consisting of the bit line BL, the word line WL and a ferroelectric film (not shown) connected between the bit line BL and the word line WL. The ferroelectric capacitor 3 is polarization-inverted through application of potential difference ±½ Vcc. The ferroelectric capacitor 3 is an example of the "storage means" in the present invention, and the ferroelectric is an example of the "material having a hysteresis property" in the present invention. The chopper comparator 2 includes an inverter circuit 4 and a switch 5. This chopper comparator 2 has a function of determining data "0" or "1" stored in the memory cell 1. The inverter circuit 4 of the chopper comparator 2 has an input terminal 4a and an output terminal 4b. The input terminal 4a of the inverter circuit 4 is connected to the bit line BL, while the output terminal 4b outputs data. The inverter circuit 4 has a potential VT of a logical threshold, which is set to a level ½ Vcc by adjusting the size etc. of a transistor constituting the inverter circuit 4. The switch 5 of the chopper comparator 2 is constituted of an n-channel transistor having a pair of source/drain regions connected to the input and output terminals 4a and 4b of the inverter circuit 4 respectively. A prescribed coupling capacitance is present between the gate of the n-channel transistor constituting the switch 5 and a diffusion layer.

A read operation of the cross-point ferroelectric memory according to the embodiment of the present invention is described with reference to FIGS. 1 to 3.

In an initial state of the cross-point ferroelectric memory according to the embodiment, the switch 5 (see FIG. 1) is in an ON state. Thus, the potentials of the input and output terminals 4a and 4b of the inverter circuit 4 connected with each other through the switch 5 reach the potential VT (½ Vcc) of the logical threshold of the inverter circuit 4. Therefore, the ferroelectric memory precharges the bit line BL to the potential VT (½ Vcc) of the logical threshold of the inverter circuit 4, as shown in FIG. 2. In the initial state, a word line driver (not shown) precharges the word line WL to the potential ½ Vcc. Thus, the ferroelectric memory precharges both of the bit line BL and the word line WL to the potential ½ Vcc so that the potential difference ($V_{WL}-V_{BL}$) therebetween reaches 0 V, thereby applying the potential difference 0 V to the memory cell 1 connected between the bit line BL and the word line WL. In the initial state, therefore, the ferroelectric capacitor 3 constituting the memory cell 1 is in a polarization state corresponding to the data "0" or "1", as shown in FIG. 3.

Figure 2:
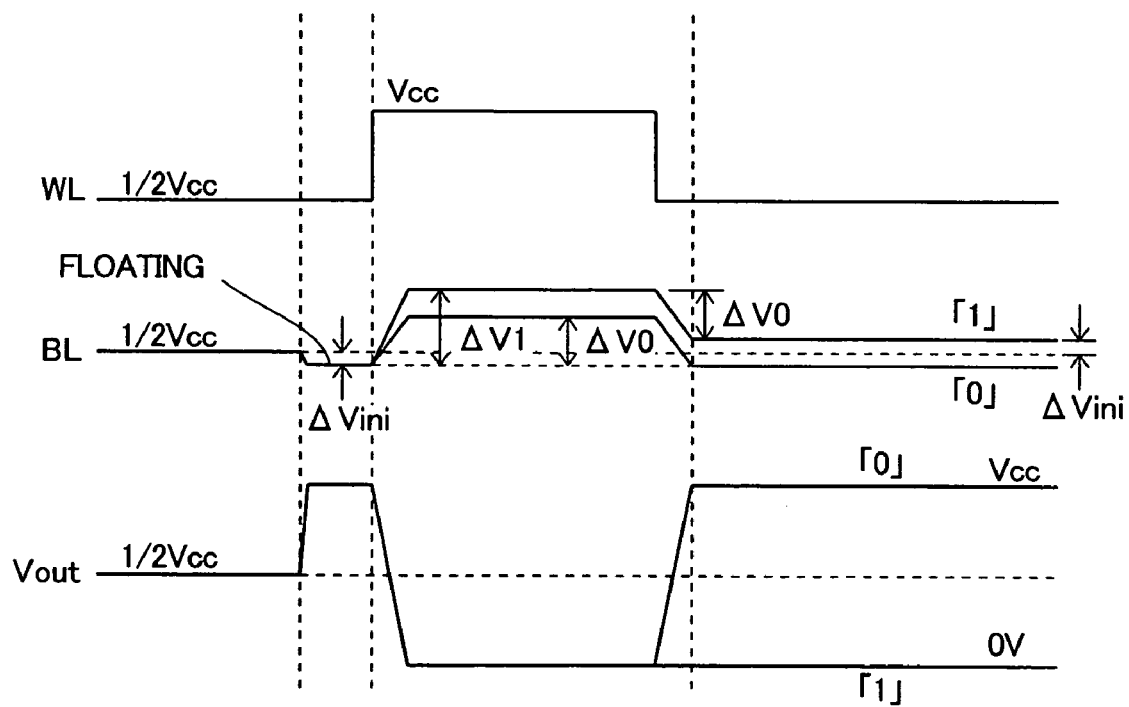
FIG. 2 is a voltage waveform diagram for illustrating a read operation of the cross-point ferroelectric memory according to the embodiment of the present invention.

According to the embodiment, the ferroelectric memory turns off the n-channel transistor constituting the switch 5 (see FIG. 1). Thus, the bit line BL enters a floating state, as shown in FIG. 2. At this time, the ferroelectric memory reduces the potential of a signal input in the n-channel transistor constituting the switch 5 from a high level to a low level, thereby reducing the potential of the bit line BL by a voltage (ΔVini) corresponding to the coupling capacitance between the gate of the n-channel transistor constituting the switch 5 and the diffusion layer. Thus, the bit line BL reaches a potential (½Vcc−ΔVini) as shown in FIG. 2.

Then, the word line WL rises to a potential Vcc so that a potential corresponding to the data "0" or "1" stored in the memory cell 1 appears on the bit line BL. If the memory cell 1 stores the data "0", the potential of the bit line BL rises to a level (½Vcc−ΔVini+ΔV0). If the memory cell 1 stores the data "1", on the other hand, the potential of the bit line BL rises to a level (½Vcc−ΔVini+ΔV1). Following the rise of the word line WL to the potential Vcc, the polarization state of the ferroelectric capacitor 3 of the memory cell 1 shifts from a point "0" to a point A in FIG. 3 if the memory cell 1 stores the data "0", while shifting from a point "1" to the point A in FIG. 3 if the memory cell 1 stores the data "1".

Figure 3:
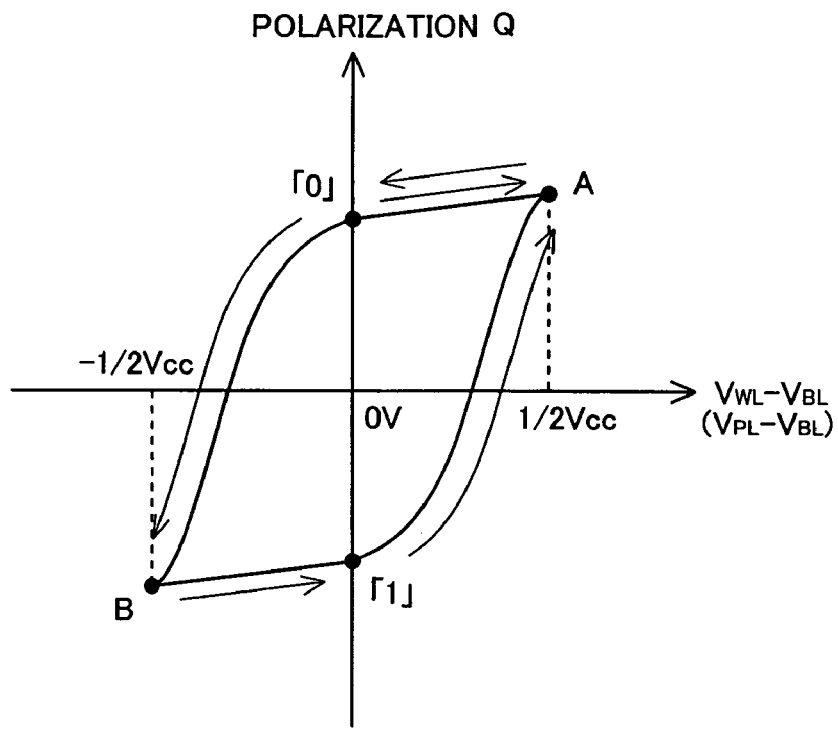
FIG. 3 is a hysteresis diagram for illustrating change of a polarization state of a ferroelectric capacitor.

Symbol ΔV0 denotes change of the potential of the bit line BL corresponding to the polarization state of the ferroelectric capacitor 3 shifting from the point "0", to the point A in FIG. 3, and symbol ΔV1 denotes change of the potential of the bit line BL corresponding to the polarization state of the ferroelectric capacitor 3 shifting from the point "1" to the point A in FIG. 3.

Then, the word line WL falls from the potential Vcc to the level ½ Vcc. Thus, the polarization state of the ferroelectric capacitor 3 of the memory cell 1 connected to the word line WL and the bit line BL shifts from the point A to the point "0" in FIG. 3 whether the memory cell 1 has stored the data "0" or "1" in the initial state, thereby reducing the potential $V_{BL}$ of the bit line BL by the change ΔV0. If the memory cell 1 has stored the data "0" in the initial state, therefore, the potential $V_{BL}$ of the bit line BL is expressed as follows:

$$V_{BL} = \frac{1}{2}Vcc - \Delta Vini + \Delta V0 - \Delta V0 \qquad (1)$$
$$= \frac{1}{2}Vcc - \Delta Vini$$

If the memory cell has stored the data "1", on the other hand, the potential $V_{BL}$ of the bit line BL is expressed as follows:

$$V_{BL}=\frac{1}{2}Vcc-\Delta Vini+\Delta V1-\Delta V0 \qquad (2)$$

According to the embodiment, the ferroelectric memory determines the data "0" or "1" through the inverter circuit 4 of the chopper comparator 2. More specifically, the ferroelectric memory determines the data by changing the output of the inverter circuit 4 to the potential 0 V or Vcc in response to whether the potential $V_{BL}$ of the bit line BL is larger or smaller than the potential VT (½ Vcc) of the logical threshold of the inverter circuit 4 of the chopper comparator 2. In other words, the ferroelectric memory determines the data as non if the potential $V_{BL}$ of the bit line BL is smaller than the potential ½ Vcc, for outputting a potential (Vout) of the level Vcc (high level) from the inverter circuit 4. If the potential $V_{BL}$ of the bit line BL is larger than the potential ½ Vcc, on the other hand, the ferroelectric memory determines the data as "1" for outputting a potential (Vout) of the level 0 V (low level) from the inverter circuit 4.

From the above expression (1), the potential $V_{BL}$ (½Vcc−ΔVini) of the bit line BL is necessarily smaller than the potential ½ Vcc if the memory cell 1 has held the data "0" in the initial state, so that the ferroelectric memory determines the data as "0" and outputs the potential (Vout) of the level Vcc through the inverter 4. The ferroelectric memory sets the voltage Vini larger than the sensitivity of the inverter circuit 4, so that the inverter circuit 4 can detect that the potential $V_{BL}$ of the bit line BL is smaller than the level ½ Vcc in this case.

From the above expression (2), the potential $V_{BL}$ of the bit line BL must at least satisfy the condition of the following expression (3) so that the inverter circuit 4 can determine the data as "1" if the memory cell 1 has held the data "1" in the initial state:

$$V_{BL}=\frac{1}{2}Vcc-\Delta Vini+\Delta V1-\Delta V0 > \frac{1}{2}Vcc \qquad (3)$$

The above expression (3) is transformed into the following expression (4):

$$\Delta Vini+\Delta V0<\Delta V1 \qquad (4)$$

From the result of the above expression, the ferroelectric memory sets the voltage ΔVini corresponding to the coupling capacitance between the gate of the n-channel transistor of the chopper comparator 2 and the diffusion layer so that the sum of the voltage ΔVini and the polarization change ΔV0 corresponding to the change of the polarization state shifting from the point "0" to the point A in FIG. 3 does not exceed the polarization change ΔV1 corresponding to the change of the polarization state shifting from the point "1" to the point A in FIG. 3, in order to enable the inverter circuit 4 to determine the data as "1" when the memory cell 1 has held the data "1" in the initial state. The ferroelectric memory so sets the voltage ΔVini at this level that the potential $V_{BL}$ (½Vcc−ΔVini+ΔV1−ΔV0) read from the memory cell 1 holding the data "1" on the bit line BL is smaller than the voltage ½ Vcc, whereby the inverter circuit 4 determines the data as "1" and outputs the potential (Vout) of 0 V (low level).

According to the embodiment, as hereinabove described, the ferroelectric memory precharges the bit line BL to the potential VT (½ Vcc) of the logical threshold of the inverter circuit 4, thereafter turns off the switch 5 of the chopper comparator 2 thereby reducing the potential of the bit line BL from the level VT (½ Vcc) of the logical threshold of the inverter circuit 4 by the voltage ΔVini through the coupling capacitance of the n-channel transistor 5, thereafter applies the voltage Vcc to the word line WL and thereafter returns the voltage of the word line WL to the level ½ Vcc for determining and reading the data in response to whether the current potential of the bit line BL is larger or smaller than the potential VT (½ Vcc) of the logical threshold of the inverter circuit 4, whereby the ferroelectric memory can read the data on the basis of the potential VT (½ Vcc) of the logical threshold of the inverter circuit 4 corresponding to the potential of the bit line BL in the initial state and the potential of the bit line BL at the time of returning the word line WL to the voltage ½ Vcc without employing a reference potential. Thus, no circuit may be provided for generating a reference potential, whereby the ferroelectric memory can be inhibited from size increase. Further, the ferroelectric memory capable of reading the data by simply activating and inactivating the word line WL with single pulses can reduce the operating time as well as current consumption.

Although the present invention has been described and illustrated in detail, it is clearly understood that the same is by way of illustration and example only and is not to be taken by way of limitation, the spirit and scope of the present invention being limited only by the terms of the appended claims.

For example, while the above embodiment have been described with reference to a ferroelectric memory as an example of the inventive semiconductor memory device comprising storage means containing a material having a hysteresis property, the present invention is not restricted to this but is also applicable to another memory comprising storage means containing a material having a hysteresis property. For example, the present invention can be applied to an MRAM, a nonvolatile memory recording data through magnetism.

While the aforementioned embodiment employ the chopper comparator as data read means for reading data stored in the memory cell(s), the present invention is not restricted to this but the inventive semiconductor memory device may alternatively employ data read means other than the chopper comparator.

Figure 4:
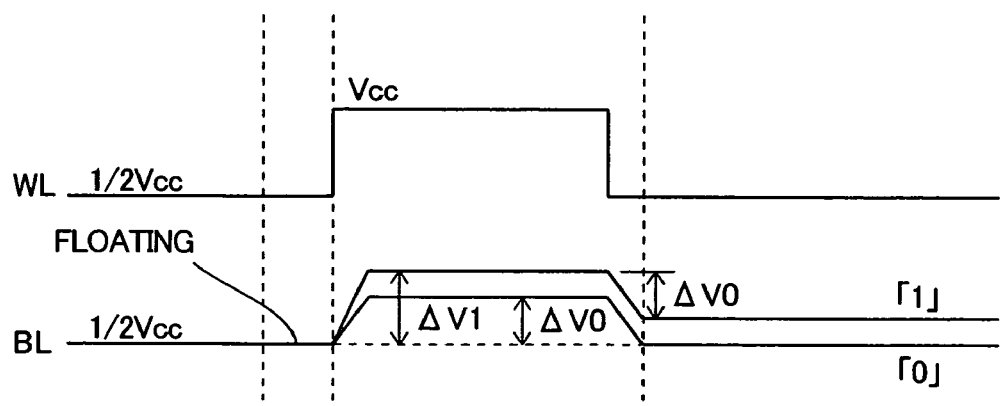
FIG. 4 is a waveform diagram showing voltages applied to a ferroelectric memory according to a modification of the embodiment of the present invention.
Figure 5:
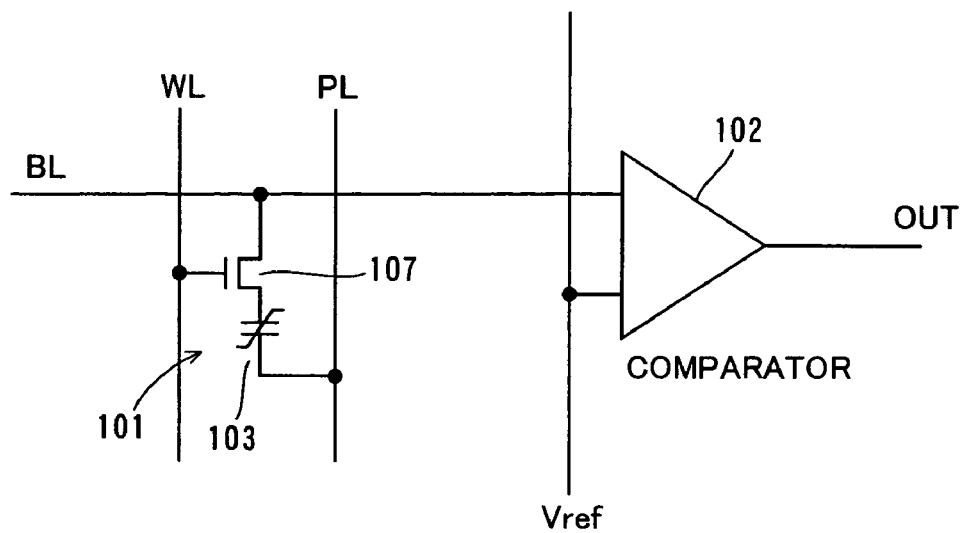
FIG. 5 is a circuit diagram showing the structure of a conventional 1T1C ferroelectric memory.
Figure 6:
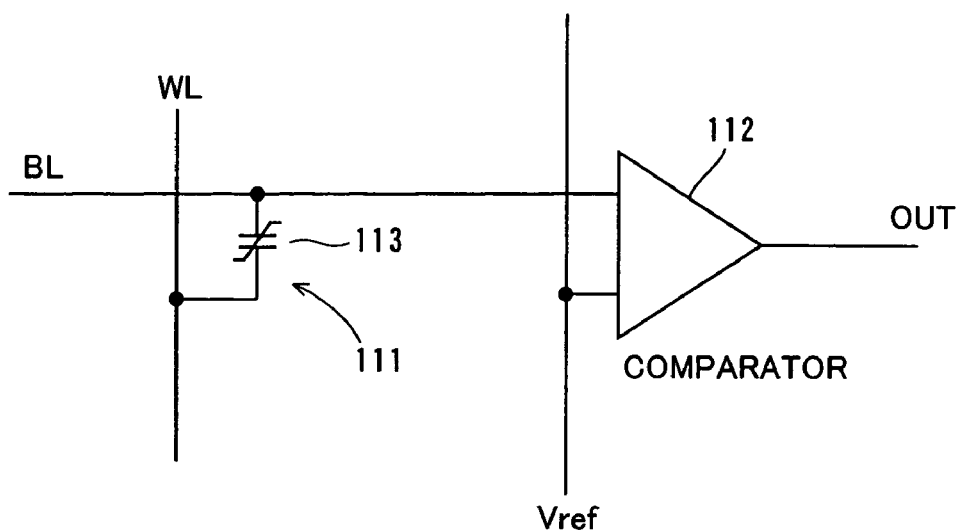
FIG. 6 is a circuit diagram showing the structure of a conventional 1C cross-point ferroelectric memory.

While the ferroelectric memory according to the aforementioned embodiment reduces the potential of the bit line BL from the potential of the logical threshold of the inverter circuit of the chopper comparator by the voltage ΔVini in the floating state of the bit line BL while determining the data in response to whether the potential of the bit line BL input in the inverter circuit is larger or smaller than the logical threshold thereof in data reading, the present invention is not restricted to this but the ferroelectric memory may alternately determine the data in response to whether the current potential of the bit line BL is equal to or different from the potential of the bit line BL in the initial state in data reading without reducing the potential of the bit line BL in the floating state thereof. In this case, the ferroelectric memory applies voltages to the word line WL and the bit line BL along voltage waveforms shown in FIG. 4. In this case, the chopper comparator of the ferroelectric memory according to the embodiment shown in FIG. 1 is replaced with data read means having a function of determining whether the potential of the bit line BL in data determination is equal to or different from the potential of the bit line BL in the initial state thereby determining the data. Also in this case, the ferroelectric memory can read the data without employing a reference potential. Thus, no circuit for generating a reference potential may be provided, whereby the ferroelectric memory can be inhibited from size increase. Further, the ferroelectric memory capable of reading the data by simply activating and inactivating the word line WL can reduce the operating time as well as current consumption.

What is claimed is:

1. A semiconductor memory device comprising:
   storage means, connected to a data read line, containing a material having a hysteresis property; and
   data read means connected to said data read line for reading data stored in said storage means,
   the semiconductor memory device supplying an energy at a prescribed level capable of changing a storage state of said storage means from an initial state of said storage means in which said energy is at an initial level supplied, and thereafter, returning supplying the energy at the initial level in order to read said data with said data read means based on a current state of said data read line and a state of said data read line during said initial state of said storage means.

2. The semiconductor memory device according to claim 1 supplying said energy at said prescribed level capable of changing said storage state of said storage means from said initial state, and thereafter returning to said initial state by eliminating said energy at said prescribed level for reading said data with said data read means on the basis of the current state of said data read line and the state of said data read line in said initial state.

3. The semiconductor memory device according to claim 1, wherein
   said storage means includes a ferroelectric capacitor, connected to said data read line, having said hysteresis property.

4. A semiconductor memory device comprising:
   storage means, connected between a bit line and a voltage application line, containing a material having a hysteresis property; and
   data read means connected to said bit line for reading data stored in said storage means,
   the semiconductor memory device bringing said bit line into a floating state while applying a voltage capable of changing a storage state of said storage means to said voltage application line from an initial state where a potential difference between said bit line and said voltage application line is substantially 0 V, and thereafter returning the voltage of said voltage application line to a level not changing said storage state of said storage means for reading said data with said data read means on the basis of a current potential of said bit line and a potential of said bit line in said initial state in data reading.

5. The semiconductor memory device according to claim 4, wherein said voltage application line is a word line, and said storage means consists of a ferroelectric capacitor, connected between said word line and said bit line, having said hysteresis property, said semiconductor memory device brining said bit line into said floating state while applying a voltage capable of changing a storage state of said ferroelectric capacitor to said word line from said initial state where the potential difference between said bit line and said word line is substantially 0 V and thereafter returning said word line to the potential in said initial state for reading said data with said data read means on the basis of the current potential of said bit line and the potential of said bit line in said initial state in said data reading.

6. The semiconductor memory device according to claim 5, wherein said data read means includes an inverter circuit, provided with an input terminal connected to said bit line and an output terminal, having a prescribed logical threshold and a switch connected to said input terminal and said output terminal of said inverter circuit, said semiconductor memory device turning on said switch of said data read means for setting an input and an output of said inverter circuit to the potential of said logical threshold thereby precharging said bit line to the potential of said logical threshold of said inverter circuit in said initial state, turning off said switch of said data read means for changing the potential of said bit line from the potential of said logical threshold of said inverter circuit by a prescribed level in said floating state of said bit line, and varying said output of said inverter circuit with whether the potential of said bit line input in said inverter circuit is larger or smaller than said logical threshold of said inverter circuit thereby reading said data in said data reading.

7. The semiconductor memory device according to claim 6, wherein said data read means is constituted of a chopper comparator including said inverter circuit and said switch.

8. The semiconductor memory device according to claim 6, wherein said inverter circuit outputs a high-level signal when the potential of said bit line is smaller than said logical threshold of said inverter circuit, while outputting a low-level signal when the potential of said bit line is larger than said logical threshold of said inverter circuit.

9. The semiconductor memory device according to claim 6, wherein the difference between the potential of said bit line input in said inverter circuit in said data reading and the potential of said logical threshold of said inverter circuit is larger than the sensitivity of said inverter circuit.

10. The semiconductor memory device according to claim 6, wherein said switch includes a transistor having a prescribed capacitance between a gate and a diffusion layer, and said transistor is turned off in said floating state of said bit line thereby changing the potential of said bit line from the level of said logical threshold of said inverter circuit by a prescribed level corresponding to said prescribed capacitance of said transistor.

11. The semiconductor memory device according to claim 5, precharging said bit line to a prescribed potential in said initial state, and determining said data in response to whether the potential of said bit line is substantially equal to or different from said prescribed potential in said initial state in said data reading.

12. The semiconductor memory device according to claim 5, wherein said storage means consists of single said ferroelectric capacitor.

13. A semiconductor memory device comprising:

storage means including a ferroelectric capacitor, connected between a bit line and a word line, having a hysteresis property; and data read means connected to said bit line for reading data stored in said storage means, the semiconductor memory device bringing said bit line into a floating state while applying a voltage capable of changing a storage state of said ferroelectric capacitor to said word line from an initial state where a potential difference between said bit line and said word line is substantially 0 V, and thereafter returning said word line to a potential in said initial state for reading said data on the basis of a current potential of said bit line and a potential of said bit line in said initial state in said data reading.

* * * * *